(12) United States Patent
Liu et al.

(10) Patent No.: US 9,091,923 B2
(45) Date of Patent: Jul. 28, 2015

(54) CONTRAST ENHANCING EXPOSURE SYSTEM AND METHOD FOR USE IN SEMICONDUCTOR FABRICATION

(75) Inventors: George Liu, Sin-Chu (TW); Vencent Chang, Hsin-Chu (TW); Norman Chen, Hsinchu (TW); Kuei Shun Chen, Hsin-Chu (TW); Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1736 days.

(21) Appl. No.: 11/677,879

(22) Filed: Feb. 22, 2007

(65) Prior Publication Data

US 2008/0206679 A1 Aug. 28, 2008

(51) Int. Cl.
G03F 1/00 (2012.01)
G03F 7/20 (2006.01)
G03F 7/004 (2006.01)

(52) U.S. Cl.
CPC .............. *G03F 1/144* (2013.01); *G03F 7/0045* (2013.01); *G03F 7/2022* (2013.01); *G03F 7/70475* (2013.01)

(58) Field of Classification Search
USPC .................................. 430/311, 312, 394, 396
See application file for complete search history.

(56) References Cited

U.S. PATENT DOCUMENTS

2002/0160317 A1* 10/2002 Richter et al. ................ 430/324
2002/0182549 A1* 12/2002 Chang et al. .................. 430/394
2005/0181313 A1*  8/2005 Shih et al. ..................... 430/394

* cited by examiner

*Primary Examiner* — Kathleen Duda
(74) *Attorney, Agent, or Firm* — Haynes and Boone, LLP

(57) ABSTRACT

Contrast enhancing exposure apparatus and method for use in semiconductor fabrication are described. In one embodiment, a method for forming a pattern on a substrate, wherein the substrate includes a photoresist layer comprising photoacid generators ("PAGs") and photobase generators ("PBGs"), is described. The method includes dividing the pattern into two component patterns; exposing the photoresist layer of the substrate to UV light through a first mask corresponding to a first one of the component patterns; subsequent to the exposing the photoresist layer of the substrate to UV light through the first mask, exposing the photoresist layer of the substrate to UV light through a second mask corresponding to a second one of the component patterns, wherein the PAGs and PBGs disposed in areas of the photoresist layer that have been exposed to UV light at least twice are activated and wherein the activated PAGs neutralize the activated PBGs in areas of the photoresist layer that have been exposed to UV light at least twice.

10 Claims, 3 Drawing Sheets

CONTRAST ENHANCING EXPOSURE SYSTEM AND METHOD FOR USE IN SEMICONDUCTOR FABRICATION

BACKGROUND

The fabrication of integrated circuits ("ICs") involves the performance of a range of chemical and physical processes on a semiconductor substrate. In general, these processes include deposition, patterning, and doping. Fundamental to all of these processes is lithography by which process three-dimensional relief images are formed on a substrate for subsequent transfer of a pattern to the substrate.

Lithography accounts for a large part of the cost of IC fabrication, due to the large number of lithography steps involved in fabrication. In addition, lithography generally presents the primary limitation to further advancements in the reduction of feature size and silicon area and the increase in transistor speed. Clearly, therefore, a balance must be struck between cost and capability when developing a lithography process.

Optical lithography is a well-known photographic process by which a photoresist layer comprising a polymer product deposited on a substrate is exposed (i.e., irradiated with UV light) and developed to form three dimensional relief images on the substrate. In general, the ideal photoresist image has the exact shape of the intended pattern in the plane of the substrate with vertical walls through the thickness of the resist. Thus, the final resist pattern is binary, with parts of the substrate covered with the resist while other parts are uncovered. Although the polymer product itself may be photoactive, generally a photoresist contains one or more photoactive components in addition to the polymer product. Upon exposure, the photoactive component acts to change the physical or chemical characteristics of the photoresist.

It has been known in the art to use a double exposure process in IC fabrication; however, current double exposure processes require additional developing, film deposition and/or etch process steps or result in a loss of contrast on the photoresist pattern.

BRIEF DESCRIPTION OF THE DRAWINGS

The features and advantages of a contrast enhancing exposure system and method for use in semiconductor fabrication in accordance with an embodiment will be more clearly understood from the following description taken in conjunction with the accompanying drawings in which like reference numerals designate similar or corresponding elements, regions, and portions, and in which.

DETAILED DESCRIPTION

Figure 1:
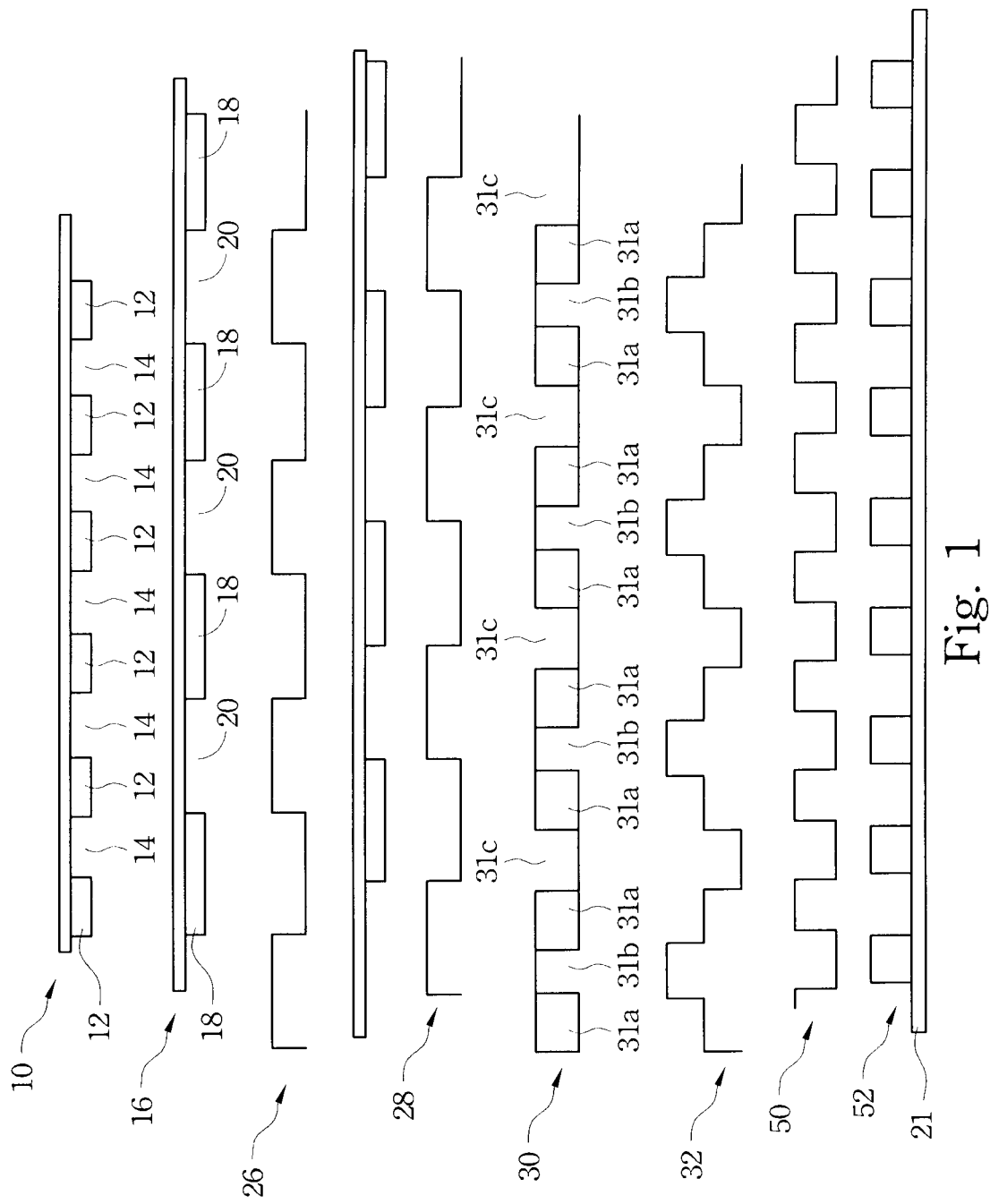
FIG. 1 illustrates a simplified example of the implementation of a contrast enhancing exposure method according to one embodiment.

FIG. 1 illustrates a simplified example of the implementation of a contrast enhancing exposure method according to one embodiment. In FIG. 1, a reference numeral 10 designates a cross-section of a mask comprising a pattern to be formed on a substrate in the fabrication of an IC. The pattern 10 includes a plurality of features 12 each having a width "W" and a plurality of features 14 each having a width "S". The term "pitch" will be used to designate the combined width of one of the features 12 and an adjacent one of the features 14. In other words, the value of the pitch for the pattern 10 is W+S.

Continuing to refer to FIG. 1, a reference numeral 16 designates a two dimensional cross-sectional representation of a mask to be used in the illustrated process. The mask 16 includes a plurality of features 18 each having a width "2W" and a plurality of features 20 each having a width "2S". In other words, the width of any one of the features 18 is two times the width of any one of the features 12; similarly, the width of any one of the features 20 is two times the width of any one of the features 14. The pitch of the mask 16 is 2W+2S. In accordance with features of one embodiment, a substrate 21, which includes a layer of photoresist, the composition of which will be described in greater detail hereinbelow, is first exposed through the mask 16. After the first exposure, the mask is shifted a distance W and the substrate 21 is exposed a second time. A line 26 represents the exposure energy resulting from the first exposure; similarly, a line 28 represents the exposure energy resulting from the second exposure. A line 30 represents the cumulative exposure energy resulting from the first and second exposures. The areas designated by reference numerals 31a are exposed only once, either during the first or second exposure. The areas designated by reference numerals 31b are exposed twice, during both the first and second exposures. The areas designated by reference numerals 31c are not exposed at all.

In accordance with features of one embodiment, and as represented by a line 32, the photoresist layer of the substrate 21 comprises photoactive components including photoacid generators ("PAGs") and photobase generators ("PBGs"). The nature of the PAGs and PBGs is such that the exposure energy resulting from a single exposure is sufficient activate the PAGs in the exposed areas, while the exposure energy resulting from double exposure is sufficient to activate both the PAGs and the PBGs in the doubly exposed areas (with the PAGs in those areas being activated by the first exposure and the PBGs being activated by the second exposure). As a result, in the doubly exposed areas, the PAGs and PBGs function to neutralize one another such that, upon development of the substrate 21, the effective result is as if the doubly exposed areas had not been exposed at all. A line 50 represents the remaining PAG distribution after developing, which results in the production of a patterned substrate 21, the cross section of which is designated by a reference numeral 52, having the same pitch W+S as the original pattern 10.

Figure 2:
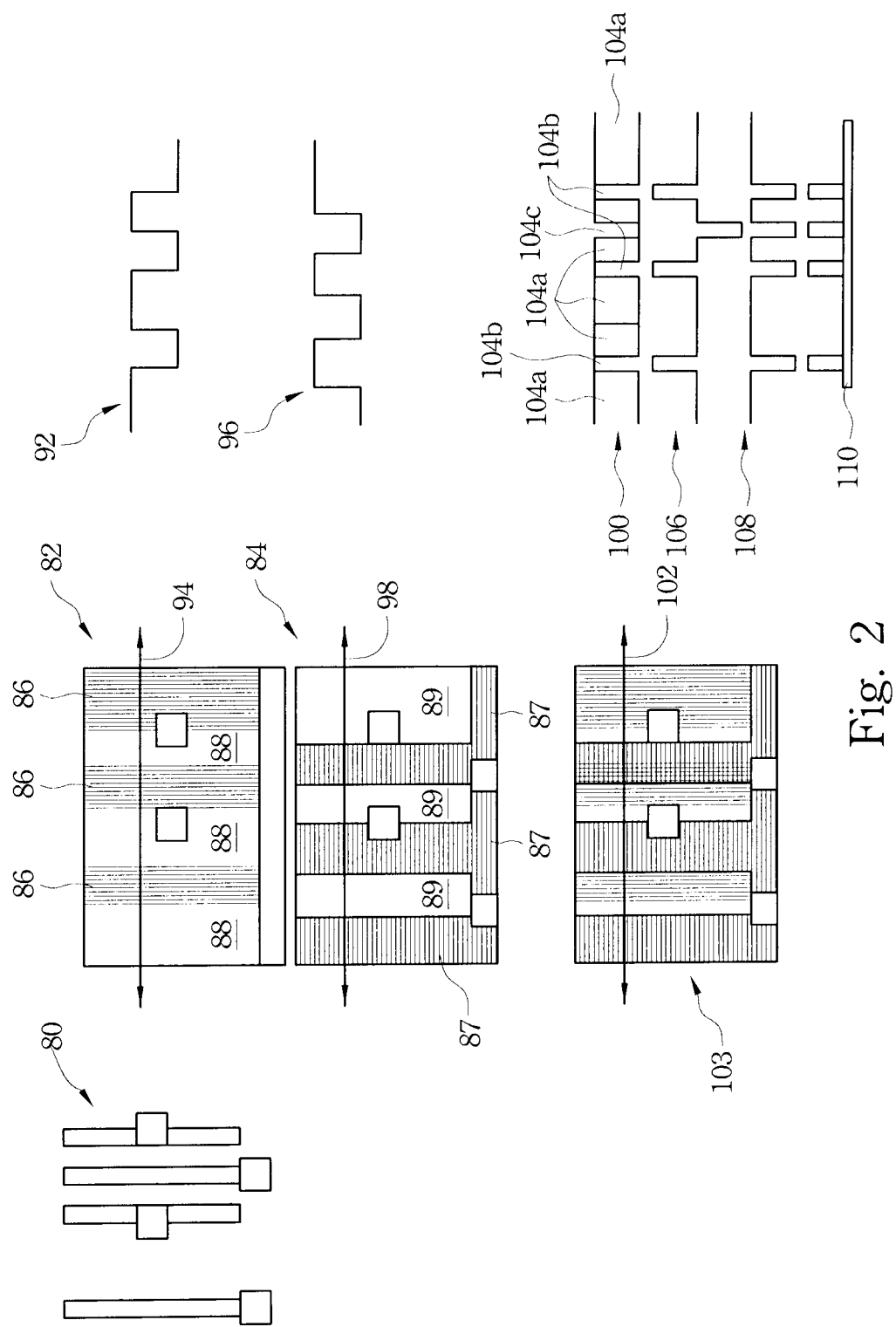
FIG. 2 illustrates a more complex example of the implementation of a contrast enhancing exposure method according to one embodiment.

FIG. 2 illustrates a more complex example of the implementation of a contrast enhancing exposure method according to another embodiment. As shown in FIG. 2, a device pattern 80 to be applied to a substrate (not shown in FIG. 2) is divided into two related patterns 82, 84, in accordance with the principles illustrated in FIG. 1. The patterns 82, 84, are used to construct corresponding masks to be used in the photolithography process. As illustrated in FIG. 2, areas 86 and 87 designate areas of the corresponding mask that are transparent and through which lithographic radiation passes during exposure of the substrate through the mask, while areas 88 and 89 designate areas of the corresponding mask that are opaque and through which lithographic radiation does not pass during exposure of the substrate through the mask. Division of the pattern 80 into related patterns 82, 84, may be performed in a number of manners; however, the guiding principle to be used in determining how to divide the pattern is that the goal is to maximize the pitch (i.e., hole plus space) in one direction (i.e., x or y direction) across the patterns 82, 84.

For purposes of example, it will be assumed that the substrate will be exposed first using the mask corresponding to the pattern 82 and then exposed for a second time using the mask corresponding to the pattern 84. Using these assumptions, a line 92 represents the exposure energy along a line 94 resulting from the first exposure alone. Similarly, a line 96 represents the exposure energy along a line 98 resulting from the second exposure alone. The combination of the two patterns 82, 84, is illustrated as a pattern 99. A line 100 represents the cumulative exposure energy along a line 102 resulting from the first and second exposures, represented by a combined pattern 103. The areas designated by reference numerals 104a are exposed only once, either during the first or second exposure. The areas designated by reference numerals 104b are exposed twice, during both the first and second exposures. The areas designated by reference numerals 104c are not exposed at all.

In accordance with features of the embodiment illustrated in and described with reference to FIG. 1, and as represented by a line 106, the photoresist layer of the substrate (not shown) comprises PAGs and PBGs each at such a level that the exposure energy resulting from a single exposure is sufficient activate the PAGs in the exposed areas, while the exposure energy resulting from double exposure is sufficient to activate both the PAGs and the PBGs in the doubly exposed areas (with the PAGs in those areas being activated by the first exposure and the PBGs being activated by the second exposure). As a result, in the doubly exposed areas, the PAGs and PBGs neutralize one another such that, upon development of the substrate, the effective result is as if the doubly exposed areas had not been exposed at all. A line 108 represents the remaining PAG distribution after developing, which results in the production of a patterned substrate 109, the cross-section of which along the line corresponding to a line 110 across the original pattern 80 is designated by a reference numeral 112. It will be recognized that the lines 94, 98, 102, and 110 are located in the same position relative to the original pattern 80.

Figure 3:
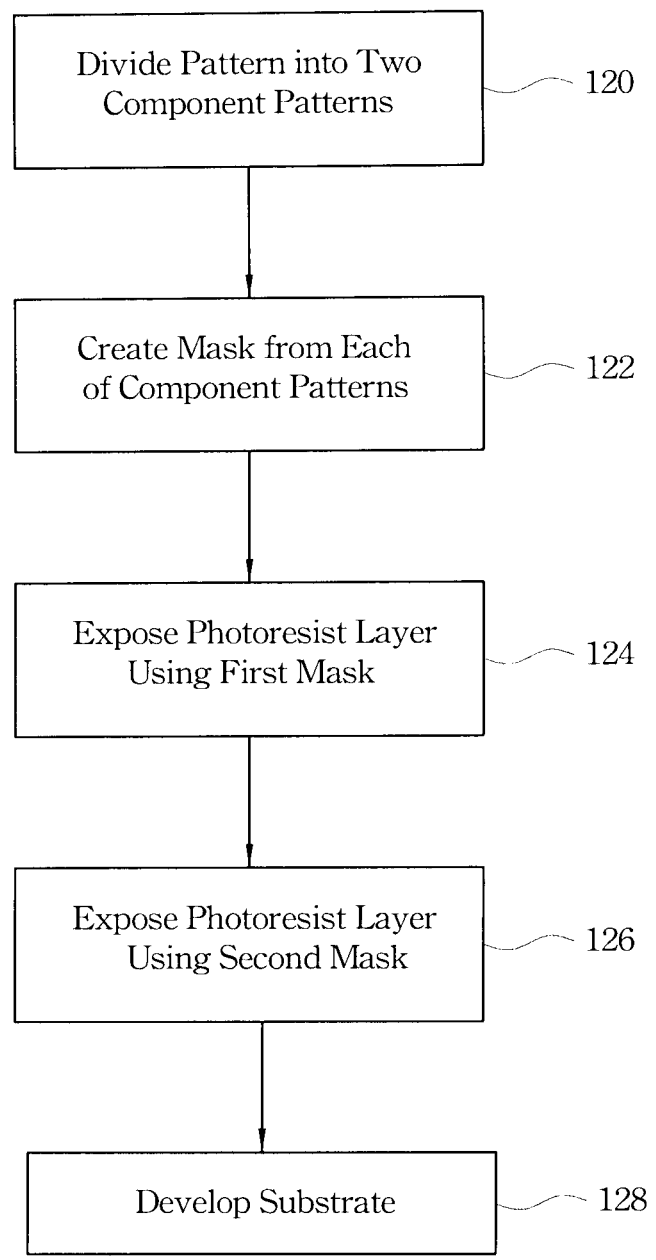
FIG. 3 is a flowchart illustrating process steps involved in implementing a contrast enhancing exposure method of one embodiment.

FIG. 3 is a flowchart illustrating a method of performing a contrast enhancing exposure method according to one embodiment. In step 120, a pattern to be formed on a substrate is divided into two component patterns. As previously indicated, division of a pattern into two component patterns may be performed in a number of manners; however, the guiding principle to be used in determining how to divide the pattern is that the goal is to maximize the pitch (i.e., hole plus space) in one direction (i.e., x or y direction) across the pattern.

In step 122, a mask is created from each of the component patterns. In step 124, a photoresist layer of a substrate on which the pattern is to be formed is exposed using a first one of the masks. In step 126, the photoresist layer is exposed to the second one of the masks. In step 128, the substrate is developed, at which point other process steps (e.g., etching, implantation, resist stripping) are performed as necessary to complete the fabrication process.

It will be recognized that, although the embodiments described herein employ PAGs that are activated by an exposure energy lower than that required to activate the PBGs, the opposite may be true, in which case the exposure energy required to activate the PBGs is less than that required to activate the PAGs.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method for forming a pattern on a substrate, the method comprising:
    dividing the pattern, which has a pitch of W+S, into two component patterns such that each of the component patterns has a pitch 2W+2S, wherein W is a width of a feature and S is a distance between two adjacent features;
    exposing the photoresist layer of the substrate to a first UV light with a wavelength through a first mask corresponding to a first one of the component patterns, wherein the substrate includes a photoresist layer comprising photoacid generators ("PAGs") and photobase generators ("PBGs"); and
    subsequent to the exposing the photoresist layer of the substrate to the first UV light with the wavelength through the first mask, exposing the photoresist layer of the substrate to a second UV light with the same wavelength as the first UV light through a second mask corresponding to a second one of the component patterns,
    wherein the PAGs in first areas of the photoresist layer that have been exposed to one or both of the first and the second UV light are activated, and wherein the PBGs in second areas of the photoresist layer that have been exposed to both the first and the second UV light are activated, and
    wherein the activated PAGs neutralize the activated PBGs in the second areas of the photoresist layer that have been exposed to both the first and the second UV light, such that a resultant pattern on the substrate has the pitch W+S.

2. The method of claim 1 further comprising, subsequent to the exposing the substrate to the second UV light through the second mask, developing the substrate.

3. The method of claim 2 wherein the developing results in the removal of areas of the photoresist layer that have been exposed to one and only one of the first UV light and the second UV light.

4. The method of claim 1 wherein the exposing the photoresist layer of the substrate to the first UV light through a first mask comprises exposing the first areas of the photoresist layer of the substrate to a first exposure energy level, the first exposure energy level being sufficient to activate either the PAGs or the PBGs in the exposed area.

5. The method of claim 4 wherein the exposing the photoresist layer of the substrate to the second UV light through a second mask comprises exposing the second areas of the photoresist layer of the substrate to a second exposure energy level, the second exposure energy level being sufficient to activate both the PAGs and the PBGs in the exposed area.

6. A method for forming a pattern on a substrate, the method comprising:
    depositing on the substrate a photoresist layer comprising photoacid generators ("PAGs") and photobase generators ("PBGs"), wherein the PAGs are activated in response to a first exposure energy and wherein the PBGs are activated in response to a second exposure energy equal to twice the first exposure energy;
    dividing the pattern, which has a pitch W+S, into two component patterns such that each of the component patterns has a pitch 2W+2S, wherein W is a width of a feature and S is a distance between two adjacent features;

exposing the substrate to a first UV light having a wavelength through a first mask corresponding to a first one of the component patterns;

subsequent to the exposing the substrate to the first UV light having the wavelength through the first mask, exposing the substrate to a second UV light having the same wavelength as the first UV light through a second mask corresponding to a second one of the component patterns;

wherein the PAGs in first areas of the photoresist layer that have been exposed to one or both of the first and second UV lights are activated, and wherein the PBGs in second areas of the photoresist layer that have been exposed to both the first and second UV lights are activated, and wherein the activated PAGs neutralize the activated PBGs in the second areas of the photoresist layer that have been exposed to both the first and second UV lights, such that a resultant pattern on the substrate has the pitch W+S.

7. The method of claim 6 further comprising, subsequent to the exposing the substrate to the second UV light through the second mask, developing the substrate.

8. The method of claim 7 wherein the developing results in the removal of areas of the photoresist layer that have been exposed to one and only one of the first and second UV lights.

9. The method of claim 6 wherein the exposing the photoresist layer of the substrate to the first UV light through a first mask comprises exposing the first areas of the photoresist layer of the substrate to the first exposure energy, the first exposure energy being sufficient to activate either the PAGs or the PBGs in the exposed area.

10. The method of claim 9 wherein the exposing the photoresist layer of the substrate to the second UV light through a second mask comprises exposing the second areas of the photoresist layer of the substrate to the second exposure energy, the second exposure energy being sufficient to activate both the PAGs and the PBGs in the exposed area.

* * * * *